United States Patent [19]

Sasaki et al.

[11] 4,411,952
[45] Oct. 25, 1983

[54] AROMATIC IMIDE POLYMER LAMINATE MATERIAL AND METHOD FOR PRODUCING THE SAME

[75] Inventors: Yoshikazu Sasaki; Hiroshi Inoue; Tadashi Miura; Kazuo Kumamoto; Sumio Toudou, all of Hirakata, Japan

[73] Assignee: UBE Industries, Ltd., Osaka, Japan

[21] Appl. No.: 370,048

[22] Filed: Apr. 20, 1982

[30] Foreign Application Priority Data

May 6, 1981 [JP] Japan .................................. 56-66888

[51] Int. Cl.³ .......................... B32B 15/08; B32B 7/02
[52] U.S. Cl. .................................. 428/332; 427/372.2; 427/388.1; 428/215; 428/334; 428/336; 428/337; 428/458; 428/473.5
[58] Field of Search ..................... 428/458, 473.5, 332, 428/334, 336, 337, 215; 427/388.1, 372.2

[56] References Cited

U.S. PATENT DOCUMENTS

| | | | |
|---|---|---|---|
| 4,302,575 | 11/1981 | Takekoshi | 428/458 X |
| 4,308,197 | 12/1981 | Byrd et al. | 428/458 X |
| 4,314,047 | 2/1982 | Banucci et al. | 428/458 X |
| 4,342,810 | 8/1982 | Adcock | 428/458 X |

Primary Examiner—Thomas J. Herbert, Jr.
Attorney, Agent, or Firm—Burgess, Ryan and Wayne

[57] ABSTRACT

An aromatic imide polymer laminate material comprising at least one aromatic imide polymer film consisting essentially of at least one aromatic imide polymer which comprises at least 80 molar % of at least one type of recurring unit of the formula (I):

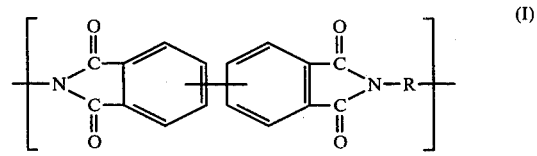

wherein R represents a divalent aromatic radical; and at least one metallic foil which is superimposed on and directly bonded to said aromatic imide polymer film, which laminate material is produced by heat-pressing said aromatic imide polymer film superimposed on said metallic foil at 250° to 600° C. under a pressure of 1 to 2,000 kg/cm² without applying a bonding agent between the polymer film and the metallic foil.

13 Claims, No Drawings

AROMATIC IMIDE POLYMER LAMINATE MATERIAL AND METHOD FOR PRODUCING THE SAME

FIELD OF THE INVENTION

The present invention relates to an aromatic imide polymer laminate material and a method for producing the same. More particularly, the present invention relates to an aromatic imide polymer laminate material comprising at least one aromatic imide polymer film and at least one metallic film superimposed on and directly bonded to each other without using a bonding agent and to a method for producing the same.

The aromatic imide polymer laminate material has an excellent heat resistance, flame retardance, durability, and bonding strength and a proper softness and flexibility and, therefore, is useful as a substrate for printed circuit board and flexible printed circuit board.

BACKGROUND OF THE INVENTION

It is known that a conventional aromatic imide polymer laminate material comprising an aromatic imide polymer film and a metallic foil is produced by bonding an aromatic imide polymer film produced from a reaction product of pyromellitic dianhydride with an aromatic diamine to a metallic foil, for example, a copper foil, with a thermo-resistant bonding agent and is usable as a substrate for printed circuit board.

In the preparation of the conventional aromatic imide polymer laminate material, it is necessary that the bonding agent exhibit a satisfactory heat resistance and an excellent bonding activity. Conventional bonding agents are, however, extremely expensive and unsatisfactory in respect to the heat resistance, chemical resistance, moisture resistance, and flexibility thereof. Therefore, when a conventional bonding agent is used to bond the aromatic imide polymer film to the metallic film, the resultant bonding layer forms a weak portion in respect to the heat resistance, chemical resistance and moisture resistance of the laminate material.

Various attempts have been made to directly bond the aromatic imide polymer film to the metallic foil by means of a heat-pressing procedure without using a bonding agent. However, such attempts have been unsuccessful because the conventional aromatic imide polymer prepared from pyromellitic acid exhibited an extremely poor bonding activity in regard to the metallic foil. Even when the pyromellitic acid-type imide polymer film was directly bonded to the metallic foil, the resultant laminate material did not exhibit a satisfactory bonding strength to the extent that the laminate material could be actually used as a printed circuit board.

Therefore, an aromatic imide polymer film which is capable of being bonded to the metallic foil by means of a heat-pressing procedure without using a bonding agent is greatly desired.

SUMMARY OF THE INVENTION

An object of the present invention is to provide an aromatic imide polymer laminate material in which at least one aromatic imide polymer film is directly bonded to at least one metallic foil without using a bonding agent and a method for producing the same.

Another object of the present invention is to provide an aromatic imide polymer laminate material having an excellent heat resistance, flame retardance and durability and a proper flexibility and a method for producing the same.

The above-mentioned object can be attained by an aromatic imide polymer laminate material which comprises at least one aromatic imide polymer film consisting essentially of at least one aromatic imide polymer which comprises at least 80 molar % of at least one type of recurring unit of the formula (I):

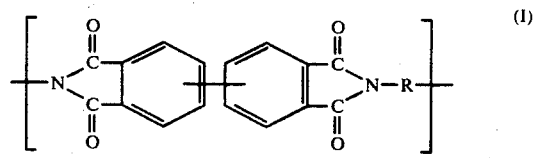

wherein R represents a divalent aromatic radical; and at least one metallic foil which is superimposed on and directly bonded to the aromatic imide polymer film without the presence of a bonding agent layer formed therebetween.

The above-mentioned aromatic imide polymer laminate material can be produced by means of the method of the present invention, which comprises the steps of:

superimposing at least one aromatic imide polymer film consisting essentially of at least one aromatic imide polymer which comprises at least 80 molar % of at least one type of recurring unit of the formula (I):

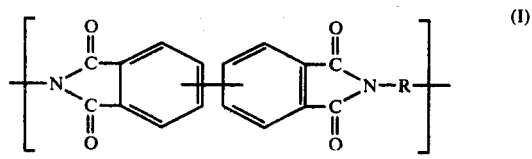

wherein R represents a divalent aromatic radical, and at least one metallic foil directly on each other to provide a precursory laminate material; and heat-pressing the precursory laminate material at a temperature of from 250° to 600° C. under a pressure of from 1 to 2,000 kg/cm², to directly bond the aromatic imide polymer film and the metallic foil to each other without using a bonding agent.

DETAILED DESCRIPTION OF THE INVENTION

In the aromatic imide polymer laminate material of the present invention, it is essential that at least one film consisting essentially of at least one specific aromatic imide polymer and at least one metallic foil be firmly bonded directly to each other in the absence of a bonding agent layer formed between the aromatic imide polymer film and the metallic foil.

Since no bonding agent which is of a special type and is expensive is used, the aromatic imide polymer laminate material of the present invention can be easily produced by means of a simple method at a low cost. Also, the aromatic imide polymer laminate material of the present invention is free from such disadvantageous as unsatisfactory heat resistance, flame retardance, chemical resistance and moisture resistance, which disadvantages are due to the presence of the bonding agent layer.

Furthermore, it is important that in spite of the fact that no bonding agent is used, the specific aromatic imide polymer film can be firmly bonded to the metallic film by means of a heat-pressing procedure.

The aromatic imide polymer film usable for the present invention is comprised essentially of at least one aromatic imide polymer which comprises at least 80 molar %, preferably 90 molar % or more, of at least one type of recurring unit of the formula (I):

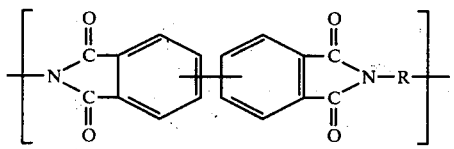

wherein R represents a divalent aromatic radical which may be a divalent aromatic heterocyclic radical.

The divalent aromatic radical represented by R may be a residue of an aromatic diamine of the formula: $H_2N-R-NH_2$, from which two amino groups are excluded.

The recurring unit of the formula (I) involves the recurring units of the formulae (II) and (III), preferably the recurring unit of the formula (II):

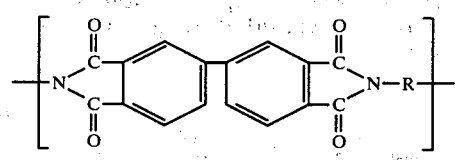

and

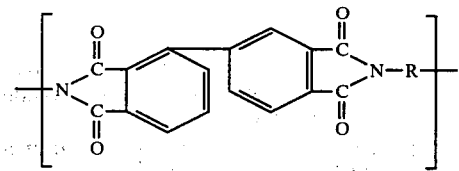

The divalent aromatic radical represented by R in the formula (I) is preferably selected from the group consisting of the radicals of the formulae:

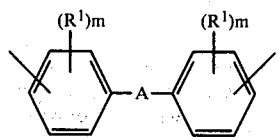

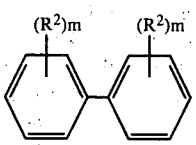

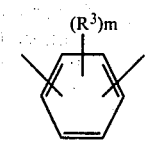

and

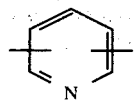

wherein $R^1$, $R^2$, and $R^3$, respectively, represent, independently from each other, a member selected from the group consisting of a hydrogen atom, lower alkyl radicals having 1 to 3 carbon atoms, and lower alkoxyl radicals having 1 to 3 carbon atoms; A represents a divalent linking member selected from the class consisting of —O—, —S—, —CO—, —SO$_2$—, —SO—, —CH$_2$—, and —C(CH$_3$)$_2$—; and m represents an integer of from 1 to 4.

The aromatic imide polymer film can be prepared in the following manner. A biphenyl tetracarboxylic acid component and an aromatic diamine component, the molar amounts of which are approximately equal, are polymerized in an organic polar solvent at a temperature of approximately 100° C. or less, preferably 60° C. or less, to produce an aromatic polyamic acid. The resultant polymerization mixture, which comprises a solution of the resultant polyamic acid in the organic solvent and is used as a dope solution, is coated or spread on a surface of a substrate to form a film of the dope solution, the dope solution film is dried by evaporating the solvent at an elevated temperature while the polyamic acid is imide ring-cyclized to form the corresponding aromatic imide polymer, and, finally, the dried aromatic imide film is separated from the substrate surface.

In another process for producing the aromatic imide polymer film, the aromatic polyamic acid is imide ring-cyclized by heating it at a temperature of from 150° to 300° C. or by heating it at a temperature of 150° C. or less in the presence of an imidization accelerator, and a solution of the resultant imide polymer in an organic solvent is converted to a dry film in a manner similar to that mentioned above.

In still another process for producing the aromatic imide polymer film, a polymerization mixture containing a biphenyl tetracarboxylic acid component and an aromatic diamine component is heated in a phenolic solvent, for example, phenol, cresol, monohalogenated phenol or monohalogenated cresol, at a temperature of from 150° to 300° C. so as to polymerize and imidize the above-mentioned polymerization components to prepare an aromatic imide polymer in a single procedure, and the reaction mixture solution, which is used as a dope solution, is converted to a dry film by means of a method similar to that described above.

The aromatic imide polymer usable for the present invention can be prepared by bringing about a polymerization-imidization reaction between a tetracarboxylic acid component comprising at least 80 molar %, preferably 90 molar %, of at least one biphenyl tetracarboxylic acid such as a 3,3',4,4'- or 2,3,3',4'-biphenyl tetracarboxylic acid compound and a diamine component comprising at least one aromatic diamine compound of the formula, $H_2N-R-NH_2$, wherein R is as defined above. The polymerization-imidization reaction can be brought about by means of any conventional process.

In the above-mentioned processes for producing the aromatic imide polymer, the tetracarboxylic acid component must comprise, as a main ingredient, 80 molar % or more of at least one biphenyl tetracarboxylic acid compound.

The biphenyl tetracarboxylic acid compounds may be selected from free acids, dianhydrides, salts, and lower alkyl esters of 3,3',4,4'-biphenyl tetracarboxylic acid and 2,3,3',4'-biphenyl tetracarboxylic acid.

The above-mentioned tetracarboxylic acid compounds may be used alone or in mixtures thereof.

The tetracarboxylic acid component may contain, in addition to the above-mentioned specific tetracarboxylic acids, 20 molar % or less, preferably 10 molar % or less, based on the entire amount of the tetracarboxylic acid component, of one or more other tetracarboxylic acids, for example, pyromellitic acid, benzophenone tetracarboxylic acids, 2,2-bis (3,4-dicarboxyphenyl) propane, bis (3,4-dicarboxyphenyl) sulfone, bis (3,4-dicarboxyphenyl) ether, bis (3,4-dicarboxyphenyl) thioether, bis (3,4-dicarboxyphenyl) methane, bis (3,4-dicarboxyphenyl) phosphine, butane tetracarboxylic acid, and anhydrides, salts, and esters thereof.

The aromatic diamines usable for producing the aromatic imide polymer may be selected from those having one or two benzene rings, preferably from the group consisting of those of the formulae (IV), (V), (VI) and (VII)

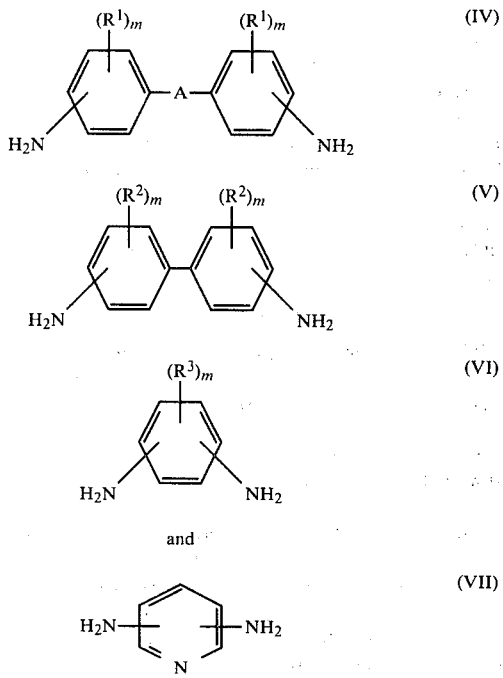

wherein $R^1$, $R^2$, $R^3$, A, and m are as defined hereinabove.

The aromatic diamines of the formula (IV) may involve: diphenyl ether compounds, for example, 4,4'-diaminodiphenyl ether (hereinafter referred to as DADE for brevity), 3,3'-dimethyl-4,4'-diaminodiphenyl ether, 3,3'-dimethoxy-4,4'-diaminodiphenyl ether, 3,3'-diaminodiphenyl ether, and 3,4'-diaminodiphenyl ether; diphenyl thioether compounds, for example, 4,4'-diaminodiphenyl thioether, 3,3'-dimehyl-4,4'-diaminodiphenyl thioether, 3,3'-dimethoxy-4,4'-diaminodiphenyl thioether, and 3,3'-diaminodiphenyl ether; benzophenone compounds, for example, 4,4'-diaminobenzophenone and 3,3'-dimethyl-4,4'-diaminobenzophenone; diphenyl methane compounds, for example, 3,3'-diaminodiphenyl methane, 4,4'-diaminodiphenyl methane (hereinafter referred to as DADM for brevity), 3,3'-dimethoxy-4,4'-diaminodiphenyl methane, and 3,3'-dimethyl-4,4'-diaminodiphenyl methane; bisphenyl propane compounds, for example, 2,2-bis (4-aminophenyl) propane and 2,2-bis (3-aminophenyl) propane; diphenyl phosphine compounds, for example, 3,3'-diaminodiphenyl phosphine and 4,4'-diaminodiphenyl phosphine; 4,4'-diaminodiphenyl sulfoxide; 4,4'-diaminodiphenyl sulfone; and 3,3'-diamino-diphenyl sulfone.

The aromatic diamines of the formula (V) may involve benzidine, 3,3'-dimethyl benzidine, 3,3'-dimethoxybenzidine (ortho-dianisidine), and 3,3'-diaminobiphenyl.

The aromatic diamine of the formula (VI) is selected from o-, m-, and p-phenylene diamines. The aromatic diamines of the formula (VII) may be selected from 2,6-diaminopyridine, 2,5-diaminopyridine, and 3,4-diaminopyridine.

In the preparation of the aromatic imide polymer, preferable aromatic diamine compounds are diphenyl ether-type diamine compounds, for example, 3,3'-diaminodiphenyl ether and 4,4'-diaminodiphenyl ether. The diphenyl ether-type diamine compounds may be used alone or in combination with other aromatic diamine compounds.

The aromatic imide polymer usable for the present invention comprises at least 80 molar %, preferably at least 90%, of at least one type of recurring unit of the formula (I) and preferably exhibits a degree of imidization of at least 90%, more preferably at least 95%, a logarithmic (inherent) viscosity of from 0.2 to 7, more preferably from 0.3 to 5, determined in a concentration of 0.5 g per 100 ml of a solvent consisting of p-chorophenol at a temperature of 50° C., and a glass transition temperature of from 250° to 400° C., more preferably from 270° to 350° C.

The term "degree of imidization" used herein refers to the proportion in percent of the real amount of imide bonds existing in a polymeric chain of an aromatic polyimide to the theoretical amount of imide bonds which can theoretically exist in the polymeric chain. The amount of imide bonds can be determined by means of infrared absorption spectrum analysis. That is, the amount of imide bonds can be determined from the height of the absorption peaks at 1780 $cm^{-1}$ and 720 $cm^{-1}$.

The aromatic imide polymer film to be used to produce the laminate material of the present invention preferably has a thickness of from 10 to 200 microns, more preferably from 15 to 150 microns.

Also, the metallic foil usable for the present invention preferably has a thickness of from 1 to 500 microns, more preferably from 5 to 100 microns. Usually, the metallic foil consists of an electro-conductive metallic material, for example, copper, tungsten, nickel, chromium, iron, silver, aluminium, lead, tin, or an alloy contaning one or more of the above-mentioned metals, preferably copper or a copper-based alloy.

The most pertinent metallic foils for the present invention are copper foil and copper-based alloy foils (including electrolytic copper foil and rolled copper foil) having a thickness of from 1 to 200 microns, preferably from 5 to 100 microns.

In the aromatic imide polymer laminate material of the present invention, one or more aromatic imide polymer films and one or more metallic foils may be bonded side by side to each other. For example, a single aromatic imide polymer film is bonded to a single metallic foil to form a two-layer laminate material. In another example, both surfaces of a single aromatic imide polymer film are bonded to two metallic foils to form a three-layer laminate material.

The aromatic imide polymer laminate material of the present invention can be produced by directly bonding side by side at least one aromatic imide polymer film to at least one metallic foil, in accordance with the method of the present invention.

Before the metallic foil is bonded to the aromatic imide polymer film, the surface of the metallic foil to be bonded is preferably surface treated so that the foil surface is cleansed or roughened and has an enhanced bonding property in respect to the aromatic imide polymer film.

In the method of the present invention, at least one aromatic imide polymer film and at least one metallic foil are superimposed directly onto each other in a predetermined sequence to form a precursory laminate material and then the precursory laminate material is pressed under a pressure of 1 to 2,000 kg/cm$^2$, preferably 5 to 1,500 kg/cm$^2$ and more preferably 10 to 1,000 kg/cm$^2$, while being heated at a temperature of from 250° to 600° C., preferably at a temperature higher than the glass transition temperature of the aromatic imide polymer but not higher than 550° C., for a predetermined time period, for example, 0.1 second to 2 hours, preferably 0.5 second to one hour and more preferably one second to 30 minutes, so as to firmly bond the film directly to the foil.

In the method of the present invention, it is preferable that the heat-pressing procedure to carried out in an inert gas atmosphere consisting of, for example, nitrogen gas, helium gas, neon gas, carbon dioxide gas, or a mixture of two or more of the above-mentioned gases and/or under a reduced pressure of 50 mmHg or less, such as in a vacuum.

Before the heat-pressing procedure is carried out, either the aromatic imide polymer film or the metallic foil, preferably both, is preferably preheated to a temperature close to the heat-pressing temperature. Especially, it is preferable that the aromatic imide polymer film be preheated to a temperature of from 200° to 400° C.

The heat-pressing procedure can be effected by using any conventional heat-pressing apparatus, for example, a heat-pressing plate or a heat-pressing roll.

The aromatic imide polymer laminate material of the present invention can be used in various industrial fields, for example, as a substrate of printed circuit board or flexible printed circuit board.

SPECIFIC EXAMPLES

The specific examples presented below will serve to more fully explain how the present invention can be practically used. However, it should be understood that the examples are only illustrative and in no way limit the present invention.

EXAMPLE 1

Equivalent molar amounts of 3,3′,4,4′-biphenyl tetracarboxylic dianhydride (S-BPDA) and 4,4′-diaminodiphenyl ether (DADE) were polymerized and imidized at a temperature of 170° C. for approximately two hours in a medium consisting of p-chlorophenol. A transparent, viscous solution containing approximately 9.1% by weight of an aromatic imide polymer was obtained.

The resultant aromatic imide polymer exhibited a degree of imidization of 95% or more and a logarithmic viscosity of 2.4 determined at a concentration of 0.5 g per 100 ml of p-chlorophenol at a temperature of 50° C.

The aromatic imide polymer solution was used as a dope solution and was spread on a surface of a glass plate at a temperature of 100° C. so as to form a film of the solution having a uniform thickness of approximately of 270 microns. The film of the solution was subjected to an evaporation process at a temperature of 140° C. under a reduced pressure of 1 mmHg for approximately one hour to evaporate p-chlorophenol.

The resultant solid aromatic imide polymer film was introduced into a heating oven and was heat-treated therein at a temperature of approximately 250° C. to completely remove the solvent. The heat-treated film had a thickness of 25 microns and exhibited a glass transition temperature of approximately 300° C.

The aromatic imide polymer film was superimposed directly onto a copper foil having a thickness of 35 microns. The resultant precursory laminate material was heat-pressed by means of a heat-pressing plate at a temperature of 400° C. under a pressure of 700 kg/cm$^2$ for ten minutes.

The copper foil layer in the resultant laminate material exhibited a peeling strength, at an angle of 90 degrees, of 1.3 kg/cm.

The laminate material was immersed for 120 seconds in a soldering bath having a temperature of 300° C. Thereafter, the laminate material was subjected again to a peeling strength test. The peeling strength at a peeling angle of 90 degrees of the copper foil layer was 1.3 kg/cm, which was equal to that measured before the soldering bath treatment.

EXAMPLE 2

The same procedures for producing the aromatic imide polymer solution (dope solution) as those described in Example 1 were carried out except that the S-BPDA was replaced by 2,3,3′,4′-biphenyl tetracarboxylic dianhydride (a-BPDA), and the thickness of the film of the dope solution was changed to approximately 420 microns.

The dope solution contained approximately 9.1% by weight of an aromatic imide polymer having a degree of imidization of 95% or more and a logarithmic viscosity of 0.4.

The dope solution was subjected to the same film-forming process as that described in Example 1. The resultant dry film had a thickness of 38 microns and exhibited a glass transition temperature of 340° C.

The aromatic imide polymer film was directly bonded to a copper foil having a thickness of 35 microns in the same manner as that described in Example 1.

The resultant laminate material was subjected to the same peeling strength test as that described in Example 1.

The peeling strength at a peeling angle of 90 degrees of the copper foil in the laminate material was 1.6 kg/cm both before and after the soldering bath treatment was carried out.

EXAMPLE 3

A polymerization mixture of one mole of S-BPDA, 0.5 moles of DADE and 0.5 moles of p-phenylene diamine was subjected to polymerization for five hours in an N-methyl-2-pyrrolidone medium at a temperature of 25° C., to prepare a solution of a polyamic acid.

The resultant solution contained approximately 10% by weight of the polyamic acid dissolved uniformly in N-methyl-2-pyrrolidone and exhibited a degree of imidization of 5% or less and a logarithmic viscosity of 3.1 determined at a concentration of 0.5 g per 100 ml of N-methyl-2-pyrrolidone at a temperature of 30° C.

The polyamic acid solution was used as a dope solution and was subjected to the same film-forming process as that described in Example 1 except that the spreading of the dope solution was carried out at 50° C. to form a film of the dope solution having a thickness of approximately 540 microns, and the evaporation of N-methyl-2-pyrrolidone was carried out at a temperature of 80° C. under a reduced pressure of 1 mmHg for approximately one hour.

The resultant polyamic acid film was heated in a heating oven at a temperature of approximately 300° C. to convert the polyamic acid to the corresponding aromatic imide polymer. An aromatic imide polymer film having a thickness of 50 microns and a glass transition temperature of 300° C. was obtained.

The aromatic imide polymer film was directly bonded to a copper foil having a thickness of 35 microns by means of the same bonding procedures as those described in Example 1.

The copper foil layer in the resultant laminate material exhibited a peeling strength, at a peeling angle of 90 degrees, of 1.6 kg/cm not only before but also after the laminate material was immersed in a soldering bath at a temperature of 300° C. for 120 seconds.

EXAMPLE 4

The same procedures for producing the aromatic imide polymer dope solution as those described in Example 1 were carried out except that S-BPDA was replaced by a mixture of equivalent molar amounts of S-BPDA and a-BPDA.

The resultant dope solution contained approximately 9.1% by weight of an aromatic imide polymer which exhibited a degree of imidization of 95% or more and a logarithmic viscosity of 1.5.

The dope solution was converted to a dry aromatic imide polymer film having a thickness of 50 microns and a glass transition temperature of 340° C. by carrying out the same film-forming process as that described in Example 1.

The aromatic imide polymer film was bonded to a copper foil having a thickness of 35 microns by carrying out the same bonding procedures as those mentioned in Example 1.

The copper foil layer in the resultant laminate material exhibited a peeling strength, at a peeling angle of 90 degrees, of 1.5 kg/cm, which value did not change even after the laminate material was immersed in a soldering bath at a temperature of 300° C. for 120 seconds.

EXAMPLE 5

The same process as that described in Example 1 was carried out except that two copper foils having a thickness of 35 microns were bonded to both surfaces of the aromatic imide polymer film.

The peeling strength at a peeling angle of 90 degrees of the copper foils in the resultant laminate material was 1.4 kg/cm, which value did not change even after the laminate material was immersed for 120 seconds in a soldering bath having a temperature of 300° C.

COMPARATIVE EXAMPLE 1

A mixture of equivalent molar amounts of pyromellitic dianhydride and 4,4'-diaminodiphenyl ether was subjected to polymerization in an N-methyl-2-pyrrolidone medium at a temperature of 25° C. for four hours.

The resultant polymer solution contained approximately 10% by weight of a polyamic acid which exhibited a low degree of imidization of 5% or less and a logarithmic viscosity of 2.3 determined at a concentration of 0.5 g per 100 ml of N-methyl-2-pyrrolidone.

The polyamic acid solution was converted to a dry polyamic acid film in the same manner as that described in Example 3. The resultant dry film was heated in a heating oven at a temperature of 300° C. so as to completely convert the polyamic acid to the corresponding aromatic imide polymer.

The resultant aromatic imide polymer film had a thickness of 25 microns but did not exhibit a glass transition temperature at a temperature level lower than the thermal decomposition temperature of the resultant aromatic imide polymer.

The aromatic imide polymer film was bonded to a copper foil having a thickness of 35 microns by carrying out the same bonding procedures as those described in Example 1.

In the resultant laminate material, the copper foil layer exhibited a poor peeling strength, at a peeling angle layer exhibited a poor peeling strength, at a peeling angle of 90 degrees, of 0.2 kg/cm.

EXAMPLES 6 THROUGH 15

In each of the Examples 6 through 15, the same procedures as those described in Example 1 were carried out except that the thickness of the aromatic imide polymer film was changed to 50 microns and the bonding procedures for bonding the aromatic imide polymer film to a copper foil having a thickness of 35 microns were carried out under the conditions indicated in Table 1.

The peeling strength at an angle of 90 degrees of the copper foil layer in the resultant laminate material was as indicated in Table 1.

TABLE I

| Example No. | Heat-pressing condition | | | Peeling strength (90 degrees) (kg/cm) |
|---|---|---|---|---|
| | Temperature (°C.) | Pressure (kg/cm$^2$) | Time (min) | |
| 6 | 400 | 353 | 1 | 1.51 |
| 7 | 400 | 353 | 5 | 1.68 |
| 8 | 400 | 353 | 10 | 1.81 |
| 9 | 400 | 53 | 5 | 0.89 |
| 10 | 400 | 106 | 5 | 1.26 |
| 11 | 400 | 1410 | 5 | 1.56 |
| 12 | 325 | 353 | 5 | 0.76 |
| 13 | 350 | 353 | 5 | 1.14 |
| 14 | 375 | 353 | 5 | 1.38 |
| 15 | 450 | 353 | 5 | 1.75 |

We claim:

1. An aromatic imide polymer laminate material comprising at least one aromatic imide polymer film consisting essentially of at least one aromatic imide polymer which comprises at least 80 molar % of at least one type of recurring unit of the formula (1):

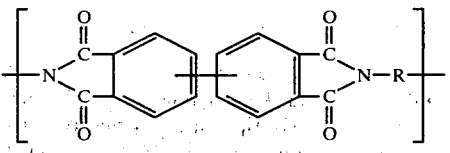

wherein R represents a divalent aromatic radical said polymer being characterized by a logarithmic viscosity of from 0.2 to 7 determined in a concentration of 0.5 g per 100 ml of p-chlorophenol at a temperature of 50° C., and a glass transition temperature of from 250° to 400° C.; and at least one metallic foil which is superimposed on and directly bonded to said aromatic imide polymer film without the presence of a bonding agent layer formed therebetween.

2. The laminate material as claimed in claim 1, wherein the thickness of said aromatic imide polymer film is in the range of from 10 to 200 microns.

3. The laminate sheet as claimed in claim 1, wherein the thickness of said metallic foil is in the range of from 1 to 500 microns.

4. The laminate material as claimed in claim 1, wherein said metallic foil consists of a member selected from the group consisting of copper, tungsten, nickel, chromium, iron, silver, aluminium, lead, tin, and alloys containing one or more of the above-mentioned metals.

5. The laminate material as claimed in claim 1, which is composed of one aromatic imide polymer film and one metallic foil directly bonded to each other.

6. The laminate material as claimed in claim 1, which is composed of one aromatic imide polymer film and two metallic foils directly bonded to both surfaces of said aromatic imide polymer film.

7. The laminate material as claimed in claim 1, wherein said aromatic imide polymer exhibits a logarithmic viscosity of from 0.3 to 5, determined in a concentration of 0.5 g per 100 ml of a solvent consisting of p-chlorophenol at a temperature of 50° C., and a glass transition temperature of from 270° C. to 350° C.

8. A method for producing an aromatic imide polymer laminate material comprising the steps of:
superimposing at least one aromatic imide polymer film consisting essentially of at least one aromatic imide polymer which comprises at least 80 molar % of at least one type of recurring unit of the formula (1):

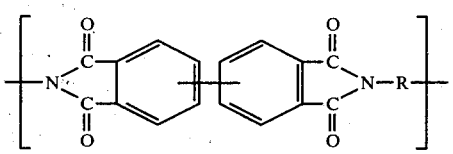

wherein R represents a divalent aromatic radical said polymer being characterized by a logarithmic viscosity of from 0.2 to 7 determined in a concentration of 0.5 g per 100 ml of p-chlorophenol at a temperature of 50° C., and a glass transition temperature of from 250° to 400° C., and at least one metallic foil directly onto each other to provide a precursory laminate material; and heat-pressing said precursory laminate material at a temperature of from 250° to 600° C. under a pressure of from 1 to 2,000 kg/cm² to directly bond said aromatic imide polymer film and said metallic foil to each other without using a bonding agent.

9. The method as claimed in claim 8, wherein said heat-pressing procedure is carried out at a temperature which is higher than the glass transition temperature of said aromatic imide polymer but not higher than 550° C.

10. The method as claimed in claim 8, wherein said heat-pressing procedure is carried out in an inert gas atmosphere and/or under a reduced pressure of 50 mmHg or less.

11. The method as claimed in claim 8, wherein before said heat-pressing procedure is carried out, said aromatic imide polymer film and/or said metallic foil is preheated at a temperature of from 200° to 400° C.

12. The process as claimed in claim 8, wherein said aromatic imide polymer exhibits a logarithmic viscosity of from 0.3 to 5, determined in a concentration of 0.5 g per 100 mil of a solvent consisting of p-chlorophenol at a temperature of 50° C., and a glass transition temperature of from 270° C. to 350° C.

13. An aromatic imide polymer laminate material made by the method of claim 8.

* * * * *